(12) United States Patent
Täuber et al.

(10) Patent No.: US 6,946,848 B2
(45) Date of Patent: Sep. 20, 2005

(54) CALIBRATION CONFIGURATION

(75) Inventors: Andreas Täuber, Unterschleissheim (DE); Thomas Hein, München (DE); Aaron Nygren, München (DE)

(73) Assignee: Infineon Technologies AG, Munich (DE)

( * ) Notice: Subject to any disclaimer, the term of this patent is extended or adjusted under 35 U.S.C. 154(b) by 152 days.

(21) Appl. No.: 10/673,965

(22) Filed: Sep. 29, 2003

(65) Prior Publication Data

US 2004/0119524 A1 Jun. 24, 2004

(30) Foreign Application Priority Data

Sep. 27, 2002 (DE) .......................................... 102 45 133

(51) Int. Cl.⁷ ........................ G01R 31/00; G01R 27/08; G01R 21/36
(52) U.S. Cl. ........................ 324/601; 324/705; 324/719
(58) Field of Search ................................ 324/601, 691, 324/705, 706, 713, 719; 702/57, 64, 65, 107, 85; 327/50, 52, 54

(56) References Cited

U.S. PATENT DOCUMENTS 6,275,090 B1 * 8/2001 Burger et al. ............... 327/334
6,388,449 B1 * 5/2002 Ramsden .................... 324/426
6,566,904 B2 * 5/2003 van Bavel et al. ............ 326/30
6,737,851 B1 * 5/2004 Roo ........................ 324/76.28

OTHER PUBLICATIONS

Van der Goes, F. M. L. et al.: "A Simple Accurate Bridge-–Transducer Interface with Continuous Autocalibration", IEEE Transactions on Instrumentation and Measurement, vol. 46, No. 3, Jun. 1997, pp. 704–710.

* cited by examiner

Primary Examiner—Anjan Deb
Assistant Examiner—John Teresinski
(74) Attorney, Agent, or Firm—Laurence A. Greenberg; Werner H. Stemer; Ralph E. Locher

(57) ABSTRACT

A calibration configuration for setting an adjustable impedance has a voltage divider with a variable resistor and a resistor connected in series, which circuit is supplied with potentials of a supply voltage and has, between the resistors, a partial voltage tap off terminal. A circuit has a further resistor, whose value is in a fixed relationship with a resistance of the first voltage divider resistor, and generates a voltage dependent upon a value derived from the further resistor. The voltage and the partial voltage are fed to a comparator for outputting a comparison result to a downstream control logic unit, which logic unit is coupled to the resistor of the first voltage divider and generates a control signal dependent upon the comparator output signal. The control logic unit control signal is used to set the variable resistor until the voltages fed to the comparator correspond to one another.

17 Claims, 3 Drawing Sheets

CALIBRATION CONFIGURATION

BACKGROUND OF THE INVENTION

Field of the Invention

The present invention relates to a calibration configuration for setting an adjustable impedance.

Calibration of an integrated circuit requires the presence of a precisely defined reference resistor, relative to which the circuit can be calibrated.

To determine the system characteristics of a circuit configuration, it is necessary to specify the output impedance in order to determine reliable values with regard to time behavior of the signal outputting, voltage consumption, and current consumption. Fluctuations with regard to the output impedance cannot be defined exactly on account of process fluctuations, operating temperature of the semiconductor chip, etc. Various calibration methods are employed nowadays in order to set specific electrical quantities to a desired amount and to eliminate manipulated variables that change during operation. A preferred method is, for example, the calibration of a circuit configuration for setting a desired output impedance relative to a reference resistor. Electronik-Grundlagen [Principles of electronics], 9th edition, Verlag Europa-Lehrmittel, Europa-No.: 31789, page 298, shows a circuit configuration corresponding to FIG. 1 having two resistors R1 and R2, which are connected in series in a first current path, and having two resistors R3 and R4, which are connected in series in a second current path. The positive supply potential VDDQ and the negative supply potential VSSQ of a supply voltage are fed to the ends of the current paths. The resistor R3 illustrated in the second current path is a resistor that is to be calibrated and can be set with regard to its resistance or impedance. Between the current paths, which also represent voltage dividers, a voltmeter is located in the actual bridge path. If the voltages U1 and U3 and, respectively, U2 and U4 across the resistors R1, R2, R3, and R4 are of the same magnitude, the null indicator exhibits no deflection. The bridge is balanced. Because the resistors are proportional to the voltages, the variable resistor can be determined by a ratio calculation:

$$U1/U2=U3/U4.$$

This also leads to the relationship: $R1/R2=R3/R4$.
Consequently, the resistor R3 can be derived:

$$R3=R4\times(R1/R2).$$

The circuit configuration illustrated is also referred to as a resistance measuring bridge for measuring an electrical resistance by current or voltage comparison of the resistor to be measured and of the known resistors.

With the use of a reference resistor for calibrating an output impedance of a circuit configuration, the two configurations described below are predominantly provided in a circuit configuration.

One possibility is, for example, the use of an off-chip reference resistor—not situated within the semiconductor chip—relative to which the circuit configuration is calibrated. Such a method has the advantage that the reference resistor situated externally with respect to the semiconductor chip can be set very precisely so that the circuit configuration can be calibrated very exactly. One disadvantage of this solution, however, is the need for external reference resistors to be provided for each semiconductor chip situated on a circuit board, relative to which reference resistors the individual circuits of a semiconductor chip can be calibrated with different requirements. The configuration of external reference resistors situated outside a semiconductor chip, furthermore, has the disadvantage that the space on the system circuit board is restricted and, consequently, an economic and cost-effective circuit board design can no longer be achieved.

A further possibility is to dispose the reference resistor within the semiconductor chip containing the circuit to be calibrated. Although such a configuration eliminates the problem of an increased space requirement on the circuit board, it, nonetheless, influences the accuracy of the reference resistance during operation because the latter is operated under the same ambient conditions as the semiconductor chip itself and is, thus, subject to the corresponding fluctuations.

The specification and setting of a reference resistor can only be effected in the production process. The reference resistor can be altered and set depending on manufacturing tolerances and device specifications in the manufacturing process by metal options, fuses, or other physical processes.

A circuit configuration that is calibrated relative to a reference resistor may be contained, for example, in an output driver stage of an off-chip driver, the calibration of the circuit configuration effecting a calibration of the output driver stage. Output driver or amplifier stages generally include complementary field-effect transistors. At least one transistor of an n-channel and a p-channel type are present, which transistors are connected in series. A plurality of transistors of the same type may be connected in parallel with the p-channel and n-channel field-effect transistors. The resistor or the impedance is formed by at least one of the field-effect transistors of the output driver, the connection or disconnection of the respective parallel field-effect transistors enabling the desired resistance to be set. The reference resistor and the resistor of the output driver form a voltage divider in a series circuit. A partial voltage to be tapped off between the two resistors is fed to a comparator with another, fixedly defined voltage, which comparator compares the voltages fed to it. The resistor to be set is set by a control signal generated by the comparator until the two voltages fed to the comparator correspond to one another. The voltages may correspond to one another, for example, if the fixedly defined voltage and the partial voltage correspond to half the supply voltage of the voltage divider. The resistances of the two resistors also correspond to one another in this case.

The problem of a reference resistor subject to the operating fluctuations is manifested here: if such a reference resistor deviates from its desired resistance by 10%, then the voltage to be tapped off between the resistors will amount to half the supply voltage only when the resistor to be set likewise has a deviation of 10% of the desired resistance.

SUMMARY OF THE INVENTION

It is accordingly an object of the invention to provide a calibration configuration that overcomes the hereinaforementioned disadvantages of the heretofore-known devices of this general type and that is as simple as possible and in which a variable resistor is calibrated relative to a reference resistor so that a desired output impedance of the resistor to be set is achieved as exactly as possible.

With the foregoing and other objects in view, there is provided, in accordance with the invention, a calibration configuration, including a first voltage divider having a variable resistor and a resistor connected in series and defining a terminal therebetween for tapping off a partial voltage between the variable resistor and the resistor, a positive terminal connected to the variable resistor for feeding in a positive supply potential of a supply voltage, and a negative terminal connected to the resistor for feeding in a negative supply potential of the supply voltage. The calibration configuration has a circuit configuration with an output terminal for providing a voltage, a further resistor having a value in a fixed relationship with a resistance of the resistor of the first voltage divider, an evaluation device connected to the further resistor and generating a control signal dependent upon a value derived from the further resistor, and a voltage generator connected to the evaluation device and generating the voltage from a multiplicity of possible voltages in a manner dependent on the control signal. The calibration configuration also has a comparator with a first input connected to the output terminal of the circuit configuration for feeding in the voltage, a second input connected to the terminal for tapping off the partial voltage, and an output terminal for outputting a comparison result of a comparison of the voltage and the partial voltage respectively fed in at the first input and at the second input. Also, the calibration configuration has a control logic unit connected downstream of the comparator with respect to an input-to-output direction of the comparator, the control logic unit having an output terminal coupled to the variable resistor of the first voltage divider and generating, dependent upon the comparison result, a control signal at the output terminal driving the variable resistor.

The calibration configuration has the advantage that, in order to calibrate the first variable resistor of the first voltage divider, a voltage is generated in a manner dependent on the resistance of the reference resistor so that the voltage fed to the comparator compensates for fluctuations in the resistance of the reference resistor and a desired output impedance of the resistor to be set is obtained as exactly as possible.

In accordance with another feature of the invention, the circuit configuration has an input terminal for feeding in a reference current and a terminal for tapping off a voltage across the further resistor, the terminal being connected to the input terminal and to the further resistor and a voltage dependent upon the reference current being tapped off at the terminal, and the evaluation device is connected to the terminal for tapping off the voltage across the further resistor and has an output terminal for tapping off the control signal therefrom.

In accordance with a further feature of the invention, the circuit configuration has a further resistor having a terminal at which a voltage can be tapped off in a manner dependent on the reference current.

In accordance with an added feature of the invention, the circuit configuration has a voltage generator with a multiplexer and a further voltage divider, the voltage generator is connected downstream of the evaluation device with respect to an input-to-output direction of the evaluation device, the multiplexer, dependent upon the control signal output by the evaluation device, selecting a voltage from a plurality of voltages provided by the further voltage divider and providing the selected voltage as the voltage at the output terminal.

In accordance with an additional feature of the invention, the evaluation device has a combination element, which is connected to the further resistor through the terminal, and that the combination element takes up the voltage across the further resistor and has a further terminal for feeding in values representing the supply potentials of the supply voltage, a value representing the target impedance of the first resistor that is to be set, and a value representing the reference current.

In accordance with yet another feature of the invention, the evaluation device has an analog-to-digital converter, which is connected downstream of the combination element and which converts the output signal of the combination element into a control signal, for outputting at the output terminal of the evaluation device.

In accordance with yet a further feature of the invention, the combination element is programmed to carry out the calculation:/R*Icopy+Vrefcopy) where: Vrefcopy corresponds to the voltage across the further resistor; V corresponds to a supply voltage to be fed to the first voltage divider; R corresponds to the variable resistor of the first voltage divider; and Icopy corresponds to the reference current of the circuit configuration.

In accordance with yet an added feature of the invention, the voltage divider includes a resistor network having a multiplicity of resistors, which, for their part, are connected in series. The voltage divider has at least one intermediate for tapping off a value of the voltage Vcomp.

In accordance with yet an additional feature of the invention, the multiplexer is driven by the output signal of the evaluation device and couples one of the intermediate taps of the voltage divider to the output terminal in a manner dependent on the output signal of the evaluation device.

In accordance with again another feature of the invention, the calibration configuration has an output driver having at least two field-effect transistors of complementary channel types, whose drain-source paths are connected in series, and that the first resistor of the first voltage divider is formed by at least one of the field-effect transistors of the output driver.

In accordance with again a further feature of the invention, at least one further field-effect transistor is in each case connected in parallel with the field-effect transistors and the gate terminals of the field-effect transistors are connected to the output terminal of the control logic unit for the purpose of feeding the control signal and for the purpose of disconnecting or connecting the parallel field-effect transistors.

In accordance with again an added feature of the invention, the calibration configuration is monolithically integrated on an integrated semiconductor chip.

In accordance with a concomitant feature of the invention, the first voltage divider and the comparator are monolithically integrated in a semiconductor chip, and the evaluation unit is disposed in an automatic test machine not situated on the semiconductor chip, the automatic test machine serving for testing the semiconductor chip.

The calibration configuration according to the invention has the advantage that, in the event of fluctuations in the resistance of the reference resistor, a setting of the reference resistor in the manufacturing process, for example, allows a higher tolerance range with regard to the resistance. The calibration configuration enables the generation of a voltage Vcomp in a manner dependent on the reference resistor, which voltage is compared with the partial voltage to be tapped off at the reference resistor. Consequently, the voltage Vcomp to be generated can be adapted to the voltage across the reference resistor so that a desired impedance of the variable resistor is obtained.

Furthermore, the calibration configuration according to the invention can be used to adapt a multiplicity of reference resistances without forming a setting of the reference resistor.

An exact setting of a reference resistor can be effected in the manufacturing process by, for example, metal options or fuses, but means a further process step for each individual semiconductor chip, thus affecting the production cost. Utilizing a first voltage Vcomp generated in a manner dependent on the actual resistance of the reference resistor in the calibration configuration makes it possible to compensate for the manufacturing tolerances of the reference resistor in a very simple and cost-effective manner.

Other features that are considered as characteristic for the invention are set forth in the appended claims.

Although the invention is illustrated and described herein as embodied in a calibration configuration, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

Figure 1:
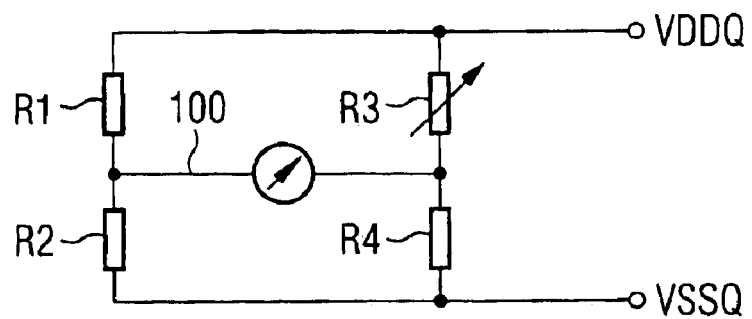
FIG. 1 is a schematic circuit diagram of a prior art calibration configuration.
Figure 2:
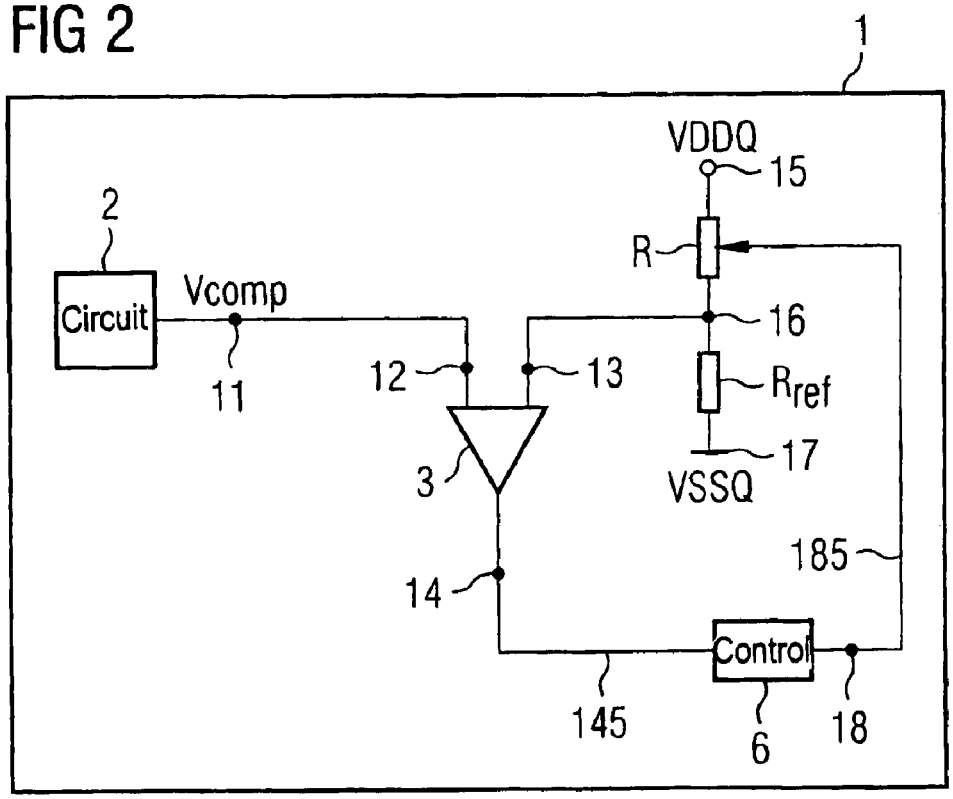
FIG. 2 is a schematic and block circuit diagram of a calibration configuration according to the invention.

Referring now to the figures of the drawings in detail and first; particularly to FIG. 2 thereof, there is shown a block diagram of the calibration configuration according to the invention. The calibration configuration 1 illustrated in FIG. 2 has a voltage divider with a first resistor R and a resistor Rref, which, for their part, are connected in series. A positive supply potential VDDQ is fed to one end of the series circuit at its terminal 15 and a negative supply potential VSSQ of a supply voltage is fed to the other end of the series circuit at the terminal 17. The series circuit has a terminal 16 at the node between the resistors R and Rref, at which terminal 16 a partial voltage Vref can be tapped off.

The calibration configuration 1, furthermore, has a circuit configuration 2, at the output terminal 11 of which a voltage Vcomp can be tapped off. A comparator 3 is connected, by a first input terminal 12, to the output terminal 11 of the circuit configuration 2 and, by a second input 13, to the tap 16 of the series circuit including the resistors R and Rref. The voltage Vcomp and the partial voltage Vref are fed to the comparator 3 through the first input 12 and through the second input 13, respectively. The comparator 3 compares the voltages present at its inputs 12 and 13 and outputs a signal 145 at an output terminal 14. A control logic unit 6, connected downstream of the comparator 3, evaluates the control signal 145 generated by the comparator 3 and generates at the output terminal 18 a control signal 185 for driving and setting the first resistor R of the first voltage divider.

If the two voltages fed to the comparator correspond to one another, the setting of the resistor R by the control signal is concluded so that the resistor R has the desired impedance.

Figure 3:
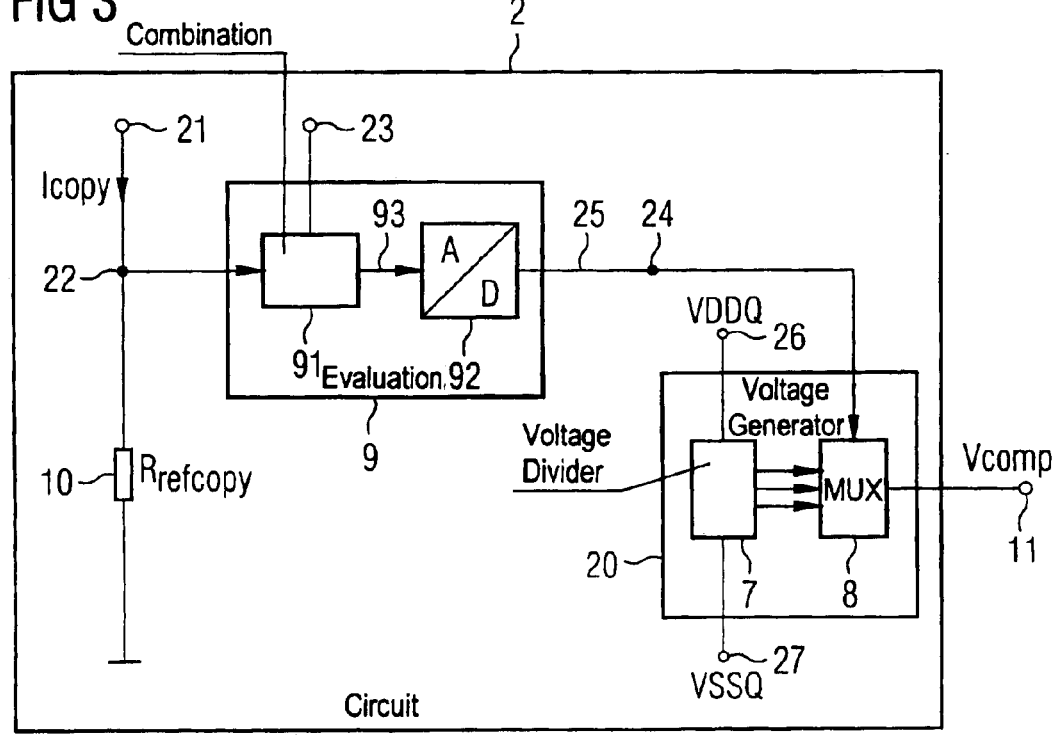
FIG. 3 is a schematic and block circuit diagram of an exemplary embodiment of a circuit configuration according to the invention that generates the voltage.

The circuit configuration 2 illustrated in FIG. 3 has a current path with an input terminal 21 for feeding in a reference current Icopy and a resistor Rrefcopy. The resistance of the resistor Rrefcopy is in a fixed relationship with the resistance of the resistor Rref of the first voltage divider illustrated in FIG. 2. The current path has a terminal 22, at which a voltage Vrefcopy can be tapped off in a manner dependent on the reference current Icopy. An evaluation device 9 includes a combination element 91 and an analog-to-digital converter 92 connected downstream. The combination element 91 is connected to the terminal 22 for tapping off the voltage Vrefcopy. Through a further terminal 23, the combination element 91 is fed values representing the supply potentials VDDQ, VSSQ of the supply voltage, a value representing the target impedance to be set of the first resistor of the first voltage divider, and a value representing the reference current Icopy. Based upon the signals present at its inputs 22 and 23, the combination element 91 generates an analog output signal 93, which is fed to the analog-to-digital converter 92. In such a case, the combination element 91 performs the following calculation to determine the control signal 93:

Proceeding from:

$$V = V_R + V_{Rref},$$

$$V_{Rref} = I*(R_{ref} + \Delta R_{ref}), \text{ and}$$

$$V_{COPY} = I_{copy}*(R_{refcopy} + \Delta R_{ref})$$

where:
R corresponds to the first resistor of the first voltage divider;
$R_{ref}$ corresponds to the resistor of the first voltage divider;
$\Delta R_{ref}$ corresponds to the deviation of the reference resistor from its desired resistance;
$R_{refcopy}$ corresponds to the resistor that is in a fixed relationship with the resistance of the first resistor $R_{ref}$;
V corresponds to the supply voltage of the first voltage divider;
$V_R$ corresponds to the voltage across the first resistor R;
$V_{ref}$ corresponds to the voltage across the resistor $R_{ref}$;
$V_{copy}$ corresponds to the voltage across the resistor $R_{refcopy}$;
I corresponds to the current that flows through the first voltage divider; and
$I_{copy}$ corresponds to the reference current that flows through the resistor $R_{refcopy}$,
the following results for the voltage $V_{Rref}$:

$$V_{ref} = (V_{copy}*V)/(R*I_{copy} + V_{copy}).$$

The voltage $V_{ref}$ determined as a result thereof corresponds to the first voltage Vcomp generated at the output terminal 11 of the circuit configuration 2.

The analog-to-digital converter 92 converts the analog signal 93 into a digital signal 25 for outputting at the output terminal 24 of the evaluation device 9. A voltage generator 20 is connected downstream of the evaluation device 9. The voltage generator has a multiplexer 8 and a voltage divider 7.

Figure 4:
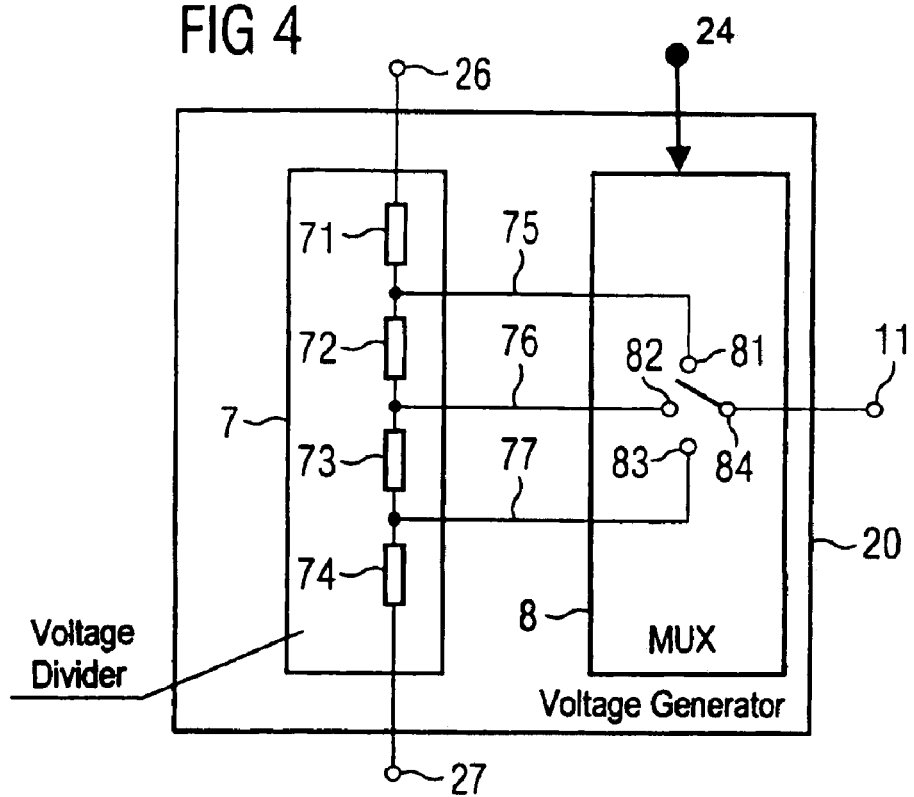
FIG. 4 is a schematic and block circuit diagram of a voltage generator according to the invention.

In the preferred embodiment shown in FIG. 4, the voltage generator 20 shown in FIG. 3 includes a multiplexer 8 connected downstream of a voltage divider 7. The voltage divider 7 has a multiplicity of resistors 71, 72, 73 and 74 connected in series. The ends of the series circuit including the resistors of the voltage divider 7 are fed the positive supply potential VDDQ at the terminal 26 and the negative supply potential VSSQ of a supply voltage at the terminal 27. A multiplicity of possible voltages is generated from the supply voltage with the aid of the voltage divider 7. The number of resistors of the voltage divider 7 may be high so that a high number of different voltages can be generated on the signal lines 75, 76, 77. The resistors of the voltage divider 7 may be conventional non-reactive resistors or, else, resistors having complex elements. The resistors can also be realized by semiconductor components. The multiplexer 8 has terminals 81, 82 and 83, connected to the signal lines 75, 76 and 77, for tapping off the individual voltages of the voltage divider. In a manner dependent on a control signal generated by the evaluation device 9, the multiplexer 8 switches a connection to one of the terminals 81, 82 and 83 by the switch 84. One of the voltages generated by the resistor network is present as voltage Vcomp at the output terminal 11 of the voltage generator 20.

Figure 5:
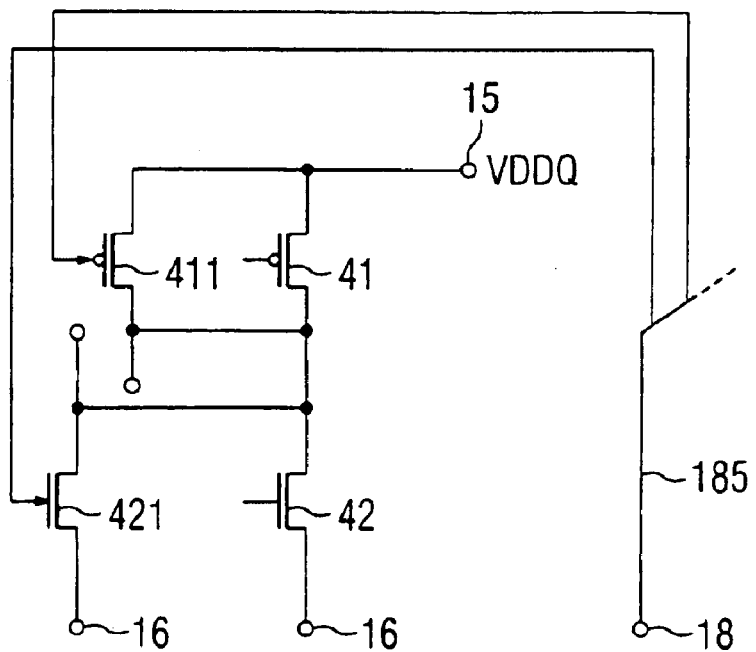
FIG. 5 is a schematic circuit diagram of an exemplary embodiment of an output driver according to the invention representing a variable resistance.

As illustrated in FIG. 5 as an exemplary embodiment, the variable first resistor R of the first voltage divider shown in FIG. 2 is formed by one of the semiconductor components 41, 42, 411 and 421 of an output driver. In an output driver, a first p-channel field-effect transistor 41 and a first n-channel field-effect transistor 42 are connected in series with regard to their drain-source paths. The positive supply potential VDDQ of the supply voltage is fed to the source terminal of the field-effect transistor 41 through the terminal 15. At least in each case one further p-channel field-effect transistor 411 and n-channel field-effect transistor 421 are connected in parallel with the field-effect transistors 41 and 42. The resistor R is formed by at least one of the field-effect transistors 41, 42, 411, and 421 of the output driver. The gate terminals of the field-effect transistors 411 and 421 are connected to the output terminal 18 of the control logic unit 6 for feeding the control signal having n bits. A coding device (not shown here) in the semiconductor chip stores the information concerning how the field-effect transistors have to be controlled so that the desired impedance of the output driver is achieved. In each case only the n-channel field-effect transistor 421 or the p-channel field-effect transistor 411 is connected or disconnected by the coding information upstream of the control logic unit 6 and the control signal 185 generated by the control logic unit 6 at the output terminal 18. The impedance of the output driver can be adapted, for example, in the time period of 100 milliseconds, because temperature fluctuations during operation of the semiconductor chip result in a change in the impedance of the output driver within this time period.

We claim:

1. A calibration configuration, comprising:
    a first voltage divider having:
        a variable resistor and a resistor connected in series and defining a terminal therebetween for tapping off a partial voltage between said variable resistor and said resistor;
        a positive terminal connected to said variable resistor for feeding in a positive supply potential of a supply voltage; and
        a negative terminal connected to said resistor for feeding in a negative supply potential of the supply voltage;
    a circuit configuration having:
        an output terminal for providing a voltage;
        a further resistor having a value in a fixed relationship with a resistance of said resistor of said first voltage divider;
        an evaluation device connected to said further resistor and generating a control signal dependent upon a value derived from said further resistor; and
        a voltage generator connected to said evaluation device and generating said voltage from a multiplicity of possible voltages in a manner dependent on said control signal;
    a comparator having:
        a first input connected to said output terminal of said circuit configuration for feeding in said voltage;
        a second input connected to said terminal for tapping off said partial voltage; and
        an output terminal for outputting a comparison result of a comparison of said voltage and said partial voltage respectively fed in at said first input and at said second input; and
    a control logic unit connected downstream of said comparator with respect to an input-to-output direction of said comparator, said control logic unit:
        having an output terminal coupled to said variable resistor of said first voltage divider; and
        generating, dependent upon said comparison result, a control signal at said output terminal driving said variable resistor.

2. The calibration configuration according to claim 1, wherein:
    said circuit configuration has:
        an input terminal for feeding in a reference current; and
        a terminal for tapping off a voltage across said further resistor, said terminal being connected to said input terminal and to said further resistor and a voltage dependent upon the reference current being tapped off at said terminal; and
    said evaluation device:
        is connected to said terminal for tapping off said voltage across said further resistor; and
        has an output terminal for tapping off said control signal therefrom.

3. The calibration configuration according to claim 2, wherein:
    said evaluation device has a combination element connected to said further resistor through said terminal for tapping off said voltage across said further resistor; and
    said combination element has a further terminal for feeding in:
        values representing the supply potentials of the supply voltage;
        a value representing a target impedance of said variable resistor to be set; and
        a value representing the reference current.

4. The calibration configuration according to claim 3, wherein:
    said combination element produces an output signal;
    said evaluation device has an analog-to-digital converter downstream of said combination element with respect to an input-to-output direction of said evaluation device; and
    said analog-to-digital converter converts said output signal of said combination element into a control signal output at said output terminal of said evaluation device.

5. The calibration configuration according to claim 3, wherein:
    said combination element is programmed to carry out the calculation:/R*Icopy+Vrefcopy) where:

Vrefcopy corresponds to said voltage across said further resistor;

V corresponds to a supply voltage to be fed to said first voltage divider;

R corresponds to said variable resistor of said first voltage divider; and

Icopy corresponds to said reference current of said circuit configuration.

6. The calibration configuration according to claim 1, wherein said circuit configuration has a voltage generator with a multiplexer and a further voltage divider, said voltage generator is connected downstream of said evaluation device with respect to an input-to-output direction of said evaluation device, said multiplexer, dependent upon said control signal output by said evaluation device, selecting a voltage from a plurality of voltages provided by said further voltage divider and providing said selected voltage as said voltage at said output terminal.

7. The calibration configuration according to claim 6, wherein said further voltage divider:
   is a resistor network having a multiplicity of resistors connected in series; and
   has at least one intermediate tap for tapping off said voltage at said output terminal.

8. The calibration configuration according to claim 7, wherein:
   said at least one intermediate tap is a plurality of taps;
   said control signal of said evaluation device drives said multiplexer; and
   said multiplexer couples one of said taps to said output terminal dependent upon said output signal.

9. The calibration configuration according to claim 1, which further comprises an output driver having at least two field-effect transistors of complementary channel types, said at least two field-effect transistors having drain-source paths connected in series, said variable resistor being formed by at least one of said field-effect transistors.

10. The calibration configuration according to claim 9, which further comprises:
   at least one further field-effect transistor respectively connected in parallel with said at least two field-effect transistors;
   said gate terminals of said at least one field-effect transistor being connected to said output terminal of said control logic unit for feeding said control signal to disconnect or connect said at least one further field-effect transistor.

11. In an integrated semiconductor chip, a monolithically integrated calibration configuration, comprising:
   a first voltage divider having:
      a variable resistor and a resistor connected in series and defining a terminal therebetween for tapping off a partial voltage between said variable resistor and said resistor;
      a positive terminal connected to said variable resistor for feeding in a positive supply potential of a supply voltage; and
      a negative terminal connected to said resistor for feeding in a negative supply potential of the supply voltage;
   a circuit configuration having:
      an output terminal for providing a voltage;
      a further resistor having a value in a fixed relationship with a resistance of said resistor of said first voltage divider;
      an evaluation device connected to said further resistor and generating a control signal dependent upon a value derived from said further resistor; and
      a voltage generator connected to said evaluation device and generating said voltage from a multiplicity of possible voltages in a manner dependent on said control signal;
   a comparator having:
      a first input connected to said output terminal of said circuit configuration for feeding in said voltage;
      a second input connected to said terminal for tapping off said partial voltage; and
      an output terminal for outputting a comparison result of a comparison of said voltage and said partial voltage respectively fed in at said first input and at said second input; and
   a control logic unit connected downstream of said comparator with respect to an input-to-output direction of said comparator, said control logic unit:
      having an output terminal coupled to said variable resistor of said first voltage divider; and
      generating, dependent upon said comparison result, a control signal at said output terminal driving said variable resistor.

12. A calibration configuration, comprising:
   a semiconductor chip having a monolithically integrated first voltage divider and a monolithically integrated comparator;
   an automatic test device not disposed on said semiconductor chip for testing said semiconductor chip, said automatic test device having an evaluation device;
   said first voltage divider having:
      a variable resistor and a resistor connected in series and defining a terminal therebetween for tapping off a partial voltage between said variable resistor and said resistor;
      a positive terminal connected to said variable resistor for feeding in a positive supply potential of a supply voltage; and
      a negative terminal connected to said resistor for feeding in a negative supply potential of the supply voltage;
   a circuit configuration having:
      an output terminal for providing a voltage;
      a further resistor having a value in a fixed relationship with a resistance of said resistor of said first voltage divider;
      said evaluation device connected to said further resistor and generating a control signal dependent upon a value derived from said further resistor; and
      a voltage generator connected to said evaluation device and generating said voltage from a multiplicity of possible voltages in a manner dependent on said control signal;
   said comparator having:
      a first input connected to said output terminal of said circuit configuration for feeding in said voltage;
      a second input connected to said terminal for tapping off said partial voltage; and
      an output terminal for outputting a comparison result of a comparison of said voltage and said partial voltage respectively fed in at said first input and at said second input; and
   a control logic unit connected downstream of said comparator with respect to an input-to-output direction of said comparator, said control logic unit:

having an output terminal coupled to said variable resistor of said first voltage divider; and generating, dependent upon said comparison result, a control signal at said output terminal driving said variable resistor.

13. A calibration configuration, comprising:

a first voltage divider having:
  a variable resistor and a resistor connected in series and defining a terminal therebetween for tapping off a partial voltage between said variable resistor and said resistor;
  a positive terminal connected to said variable resistor for feeding in a positive supply potential of a supply voltage; and
  a negative terminal connected to said resistor for feeding in a negative supply potential of the supply voltage;

a circuit configuration having:
  an output terminal for providing a voltage;
  a further resistor having a value in a fixed relationship with a resistance of said resistor of said first voltage divider;
  an evaluation device connected to said further resistor and generating a control signal dependent upon a value derived from said further resistor; and
  a voltage generator connected to said evaluation device and generating said voltage from a multiplicity of possible voltages in a manner dependent on said control signal;

a comparator having:
  a first input connected to said output terminal of said circuit configuration for feeding in said voltage;
  a second input connected to said terminal for tapping off said partial voltage; and
  an output terminal for outputting a comparison result of a comparison of said voltage and said partial voltage respectively fed in at said first input and at said second input; and a control logic unit connected to said output terminal of said comparator, said control logic unit:
  having an output terminal coupled to said variable resistor of said first voltage divider; and
  generating, dependent upon said comparison result, a control signal at said output terminal driving said variable resistor.

14. The calibration configuration according to claim 13, wherein:

said circuit configuration has:
  an input terminal for feeding in a reference current; and
  a terminal for tapping off a voltage across said further resistor, said terminal being connected to said input terminal and to said further resistor and a voltage dependent upon the reference current being tapped off at said terminal; and said evaluation device:
  is connected to said terminal for tapping off said voltage across said further resistor; and
  has an output terminal for tapping off said control signal therefrom.

15. The calibration configuration according to claim 14, wherein:

said evaluation device has a combination element connected to said further resistor through said terminal for tapping off said voltage across said further resistor; and said combination element has a further terminal for feeding in:
  values representing the supply potentials of the supply voltage;
  a value representing a target impedance of said variable resistor to be set; and
  a value representing the reference current.

16. The calibration configuration according to claim 15, wherein:

said combination element produces an output signal at an output;

said evaluation device has an analog-to-digital converter connected to said output of said combination element; and said analog-to-digital converter converts said output signal of said combination element into a control signal output at said output terminal of said evaluation device.

17. The calibration configuration according to claim 13, wherein:

said evaluation device has an output terminal for tapping off said control signal therefrom; and said circuit configuration has a voltage generator with a multiplexer and a further voltage divider, said voltage generator is connected to said output terminal of said evaluation device, said multiplexer, dependent upon said control signal output by said evaluation device, selecting a voltage from a plurality of voltages provided by said further voltage divider and providing said selected voltage as said voltage at said output terminal.

* * * * *